US008933323B1

(12) United States Patent
Gu et al.

(10) Patent No.: US 8,933,323 B1
(45) Date of Patent: Jan. 13, 2015

(54) TWO-AXIS TRACKING PARABOLIC REFLECTOR SOLAR OVEN AND STOVE

(76) Inventors: Bingwu Gu, Elk Grove, CA (US); George Helmholz, Covelo, CA (US)

( * ) Notice: Subject to any disclaimer, the term of this patent is extended or adjusted under 35 U.S.C. 154(b) by 331 days.

(21) Appl. No.: 13/333,854

(22) Filed: Dec. 21, 2011

Related U.S. Application Data (60) Provisional application No. 61/431,234, filed on Jan. 10, 2011.

(51) Int. Cl.
*H01L 31/052* (2014.01)
(52) U.S. Cl.
USPC .......................................... 136/246
(58) Field of Classification Search
CPC . H01L 31/00; H01L 31/0522; H01L 31/0525; H01L 31/058; H01L 31/0406
See application file for complete search history.

(56) References Cited

U.S. PATENT DOCUMENTS

2010/0028991 A1* 2/2010 McCall ...................... 435/292.1

* cited by examiner

*Primary Examiner* — Jonathan Johnson
*Assistant Examiner* — Christina Chern
(74) *Attorney, Agent, or Firm* — Gerald R Prettyman (57) ABSTRACT

A two-axis tracking solar cooking system includes a sunlight concentrator, a two-axis solar tracker, sunlight reflectors, an enclosure, an oven or a stove, and other components. The 90-degree offset parabolic reflector has very long focal length so that all concentrated sunlight will enter the oven through a small window at the focal point of the 90-degree offset parabolic reflector. The elevation rotation axis goes through the focal point so that the oven will remain at the same horizontal level all the time. The concentrated sunlight makes it easy to achieve needed cooking temperature. The two-axis tracking design eliminates the need of frequent adjustment. The 90-degree offset design permits having the oven under shade, so that people do not have to expose themselves to sunlight to do solar cooking. The enclosure significantly reduces the risk of burns and fires. It also makes it very easy to control the cooking process.

23 Claims, 9 Drawing Sheets

TWO-AXIS TRACKING PARABOLIC REFLECTOR SOLAR OVEN AND STOVE

CROSS-REFERENCE TO RELATED APPLICATION

This application claims benefit of priority of U.S. Provisional Patent Application 61/431,234 filed Jan. 10, 2011 and titled "TWO-AXIS TRACKING SOLAR OVEN AND STOVE," the disclosure of which is incorporated by reference. This application is related to co-pending U.S. patent application Ser. No. 13/333,841 titled "TWO-AXIS TRACKING FRESNEL LENS SOLAR OVEN AND STOVE" filed Dec. 21, 2011.

BACKGROUND OF THE INVENTION

1. Field of Invention

This invention relates to the field of solar energy, more specifically, it relates to the direct use of solar radiation for cooking, heating, and other thermal applications.

2. Description of Related Art

As the world becomes more environmental conscious, there is a rising concern regarding deforestation, green house gas emission, and finding renewable energy to replace fossil fuels. Cooking is the major necessity for people all over the world. It accounts for a major share of energy consumption in developing countries. Cooking with the sun has long been presented as a potentially viable substitute for some of the fuels used in food preparation, water pasteurizing, space and other heating.

Solar cooking has been in use since 1650, though it is not popular even in developing countries. The use of solar cookers is far below it's potential. One reason is that conventional solar oven/cookers are very difficult to use. Box-type solar cookers have trouble reaching cooking temperature, and lack controls of the cooking process. Concentrator type of solar cookers need frequent adjustment to track the sun. Long time standing nearby the concentrator in the sun also represents the risk of burns. A concentrator with its focal point in open space is also a hazard of fires.

SUMMARY OF THE INVENTION

Disclosed is a parabolic solar concentrator system (100) comprising:

a) a parabolic solar concentrator enclosure (101) having a 90-degree offset parabolic reflector side (102) in the shape of a paraboloid for focusing sunlight (108) to a focal point F (145) located a focal length (144) from the 90-degree offset parabolic reflector side (102) with b) the 90-degree offset parabolic reflector side (102) having a semi-circular edge (103) with two ends (107a, 107b) oriented such that a line (107) between the two ends (107a, 107b) forms a long parallel edge (107) of a trapezoid, with a short parallel edge (110) attached to a base side (128), with a first converging edge (111) and a second converging edge (112) equal in measurement and attached to the semi-circular top edge (103) and terminating at the short parallel edge (110), with the 90-degree offset parabolic reflector side (102) having a parabolic reflector face (113) oriented to reflect sunlight (108) toward a sunlight window side (114), and the short parallel edge (110) is smaller in measurement than the line (107) between the two ends (107a, 107b) of the semi-circular edge (103) and is equal in measurement to the edge of the base side (128);

c) a sunlight window side (114) comprising an opposite side of the parabolic solar concentrator enclosure (101) from the 90-degree offset parabolic reflector side (102), the sunlight window side (114) in the shape of a trapezoid having a long parallel edge (104), with a short parallel edge (115) attached to the base side (128), with a first converging edge (116) and a second converging edge (117) equal in measurement and attached to the long parallel edge (104) and terminating at the short parallel edge (115), with the sunlight window side (114) having a sunlight window (118) with a center (119) of a diameter (120), with the center (119) of the diameter (120) located along a focal line (138) of the 90-degree offset parabolic reflector side (102) and the short parallel edge (115) is smaller in measurement than the long parallel edge (104) and equal in measurement to edge of the base side (128);

d) a first reflector side (122) and a second reflector side (123) in the shape of a trapezoid, the first reflector side (122) and the second reflector side (123) comprising opposite sides of the parabolic solar concentrator enclosure (101), with the first reflector side (122) and the second reflector side (123) connected between the 90-degree offset parabolic reflector side (102) and the sunlight window side (114), with the first reflector side (122) having a long parallel edge (105) and a short parallel edge (124) attached to the base side (128), with the second reflector side (123) having a long parallel edge (105) and a short parallel edge (125) attached to the base side (128), with the first reflector side (122) having a first converging edge (111) and a second converging edge (116) equal in measurement and attached to the long parallel edge (106) and terminating at the short parallel edge (124), with the second reflector side (123) having a first converging edge (112) and a second converging edge (117) equal in measurement and attached to the long parallel edge (105) and terminating at the short parallel edge (125), with the first reflector side (122) having a flat reflector face (126) oriented towards the second reflector side (123) and the second reflector side (123) having a flat reflector face (127) oriented towards the first reflector side (122), and the short parallel edges (124, 125) of the first reflector side (122) and the second reflector side (123) equal in measurement to and attached to opposite edges of the base side (128);

e) a base side (128) with a first base edge (110) attached to the short parallel edge of the 90-degree offset parabolic reflector side (102), a second base edge (115) attached to the short parallel edge of the sunlight window side (114), a third base edge (124) attached to the short parallel edge of the first reflector side (122) and a fourth base edge (125) attached to the short parallel edge of the second reflector side (123), with all base edges equal in measurement, with a reflector inner face (129) facing towards the sunlight (108) and a base outer face (130) facing away from the parabolic solar concentrator enclosure (101);

f) an elevation tracking rotation axis frame (135) attached to the parabolic solar concentrator enclosure (101) and having an elevation tracking rotation pin (136) with a center (137) that is aligned on the focal line (138) with the center (119) of the diameter (120) of the sunlight window (118) and with the focal point F (145) of the 90-degree offset parabolic reflector side (102);

g) an azimuth tracking rotation axis frame (140) rotationally attached to the elevation tracking rotation axis frame (135), the azimuth tracking rotation axis frame (140) having a azimuth tracking rotation pin (141) located near the base outer face (130) of the base side (128), such that the elevation tracking rotation axis frame (135) and parabolic solar concentrator enclosure (101) may rotate independent of the azimuth tracking rotation axis frame (140) to track the sunlight (108); and h) a sunlight conversion device (142) attached to the azimuth tracking rotation axis frame (140), and having a sunlight aperture (133) for receiving concentrated sunlight at the focal point F of the 90-degree offset parabolic reflector side (102). In some embodiments, the sunlight conversion device is an oven. In some embodiments, it is a stove.

In some embodiments, the parabolic solar concentrator system (100) may further comprise one or more of an elevation tracking drive (147) or an azimuth tracking drive (148).

In some embodiments, the sunlight conversion device (142) of the parabolic solar concentrator system (100) may be a BBQ smoker, a water distiller, a food dehydrator, a circulating heat system, a clothes dryer, an absorption refrigerator, a thermal engine, or a photovoltaic panel.

In some embodiments, the parabolic solar concentrator system (100) may further comprise a cover over the parabolic solar concentrator enclosure (101) for adjusting the quantity of sunlight entering the parabolic solar concentrator enclosure (101), a sunlight blocking device for adjusting the quantity of sunlight entering the sunlight conversion device (142), a thermostatically controlled sunlight blocking device for adjusting the quantity of sunlight entering the sunlight conversion device (142), thermometer for measuring the sunlight conversion device (142) temperature, at least one reflective inner side (143) in the sunlight conversion device (142), or at least one absorptive inner side (143) in the sunlight conversion device (142).

In some embodiments, the sunlight conversion device (142) may have one or more transparent covers on the sunlight aperture (133) to limit the heat loss from the sunlight conversion device (142).

A method for converting sunlight to heat or electricity comprises receiving sunlight into a parabolic solar concentrator enclosure; reflecting and focusing the sunlight with a 90-degree offset parabolic reflector; passing the sunlight through an sunlight window aperture of the 90-degree offset parabolic solar concentrator enclosure to the focal point of the 90-degree offset parabolic reflector; and converting the sunlight into heat or electricity in a sunlight conversion device that is not moving in an elevation direction.

DETAILED DESCRIPTION

Embodiments are directed to systems and methods for converting sunlight to heat food, other materials or to make electricity.

Figure 1:
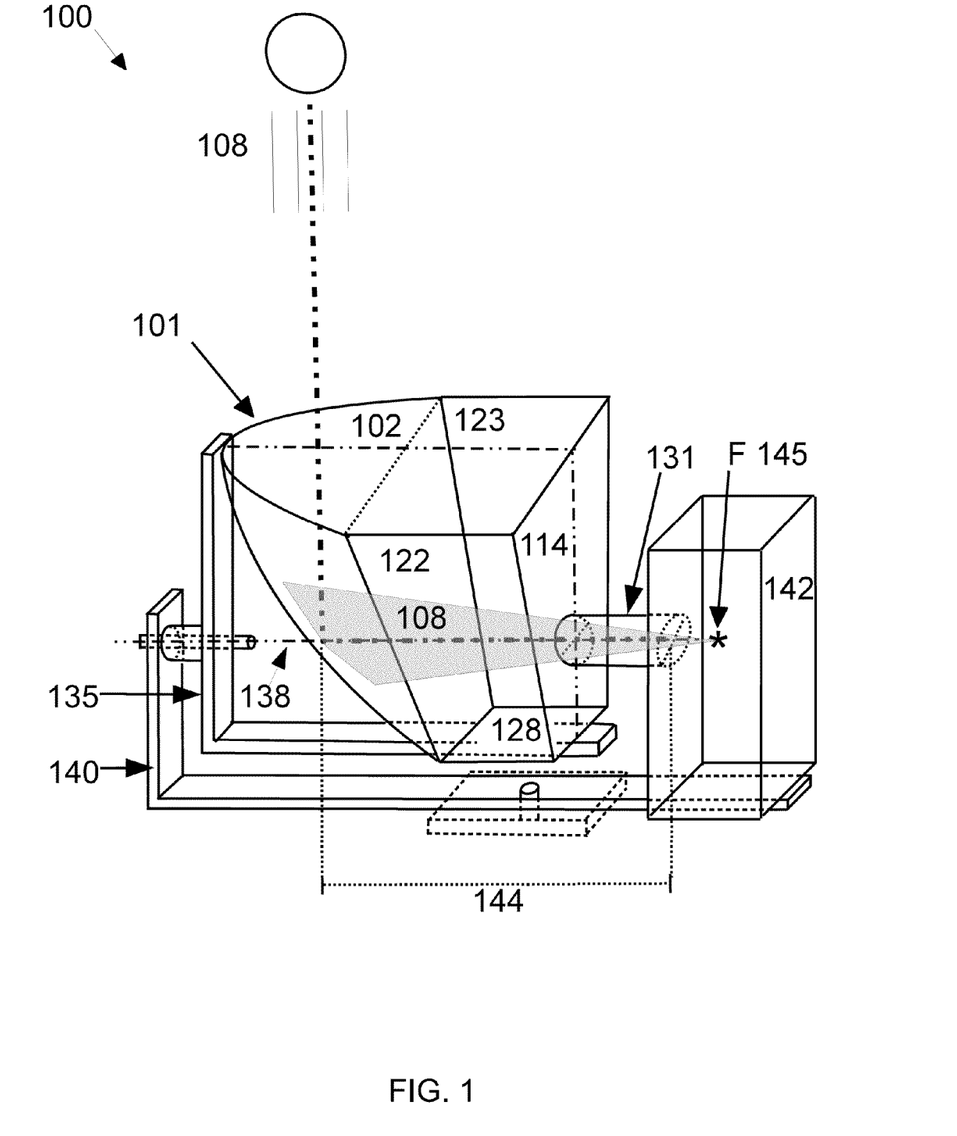
FIG. 1 shows the parabolic solar concentrator system (100) with its parabolic solar concentrator enclosure (101) and an exemplary sunlight conversion device (142).

FIG. 1 shows the solar concentrator system (100) with its parabolic solar concentrator enclosure (101) and the sunlight conversion device (142). Shown in FIG. 1 are the solar concentrator system (100), a parabolic solar concentrator enclosure (101), sunlight (108), a sunlight conversion device (142), a 90-degree offset parabolic reflector side (102), a sunlight window side (114), a first reflector side (122), a second reflector side (123), a base side (128), a loss reduction tube (131), an elevation tracking rotation axis frame (135), a focal line (138), an azimuth tracking rotation axis frame (140) and a sunlight conversion device (142).

Of the features as shown in FIG. 1, the solar concentrator system (100) comprises a parabolic solar concentrator enclosure (101) and a sunlight conversion device (142). The parabolic solar concentrator enclosure (101) comprises five sides. These sides are a 90-degree offset parabolic reflector side (102), a sunlight window side (114), a first reflector side (122), a second reflector side (123) and a base side (128). In some embodiments, a parabolic solar concentrator enclosure cover may be included.

Hinges may be used to connect the sides of the parabolic solar concentrator enclosure (101). When the solar concentrator system is not in use, the parabolic solar concentrator enclosure (101) can be folded into a small package. It becomes a portable folding system for easy storage and travel.

Optically attached to the parabolic solar concentrator enclosure (101) is a sunlight conversion device (142). In some embodiments, the sunlight conversion device is an oven. In some embodiments, the sunlight conversion device is a stove. In some embodiments an optional loss reduction tube (131) may be between the parabolic solar concentrator enclosure (101) and the sunlight conversion device (142).

Also attached to the parabolic solar concentrator enclosure (101) is an elevation tracking rotation axis frame (135). Rotationally affixed to the elevation tracking rotation axis frame (135) is an azimuth tracking rotation axis frame (140), to which is affixed the sunlight conversion device (142).

Each of these features is shown and explained in further detail through the other Figures.

Figure 2:
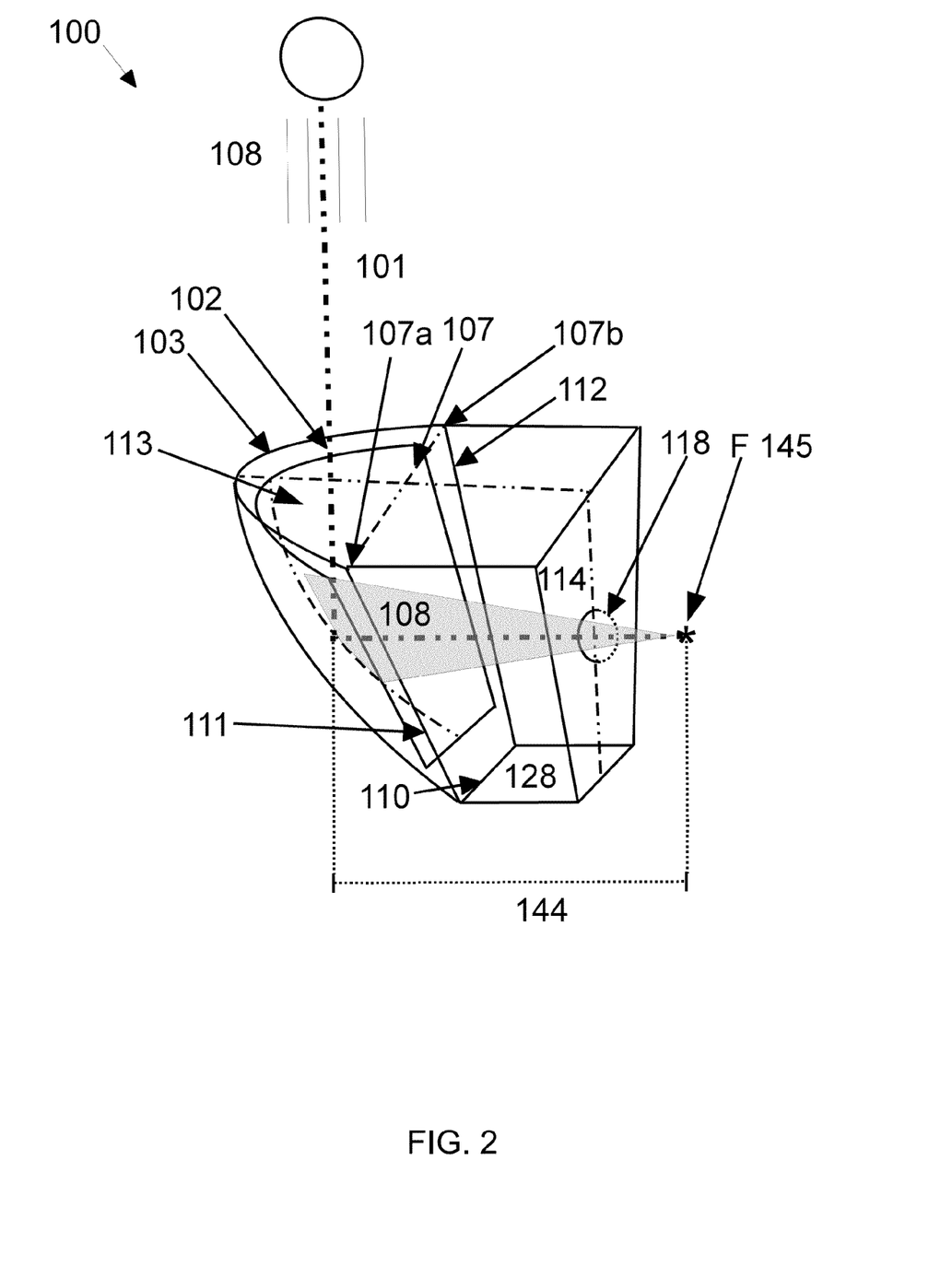
FIG. 2 is a partial drawing of the parabolic solar concentrator system (100) with its parabolic solar concentrator enclosure (101) showing the 90-degree offset parabolic reflector side (102).

FIG. 2 is a partial drawing showing the solar concentrator system (100) with its parabolic solar concentrator enclosure (101) showing the 90-degree offset parabolic reflector side (102).

Of the features as shown in FIG. 2 are the solar concentrator system (100), the parabolic solar concentrator enclosure (101), a 90-degree offset parabolic reflector side (102), a parabolic reflector side semi-circular top edge (103), sunlight (108), a parabolic reflector side short parallel edge (110), a parabolic reflector side first converging edge (111), a parabolic reflector side second converging edge (112), a parabolic reflector face (113), a first reflector side (122), a sunlight window side (114), a second reflector side (123), and the base side (128).

The 90-degree offset parabolic reflector side (102) is in the shape of a parabola. The 90-degree offset parabolic reflector side (102) is a section of a much larger prime-focused parabolic dish. The focal length of the 90-degree offset parabolic reflector side (102) is about two times of the focal length of the original large parabolic dish. The 90-degree offset parabolic reflector side (102) has a semi-circular top edge (103). The semi-circular top edge (103) has two ends, one (107a) at an intersection with a first converging edge (111) and one (107b) at an intersection with a second converging edge (112).

The 90-degree offset parabolic reflector side (102) has a short edge (110) that is attached to a base side (128). The base side (128) would be opposite a parabolic solar concentrator enclosure cover if one were optionally used with the parabolic solar concentrator enclosure (101). The length of the short parallel edge (110) is the same as the attached edge of the base side (128).

The 90-degree offset parabolic reflector side (102) has a first converging edge (111) and a second converging edge (112), which are equal as measured from the semi-circular top edge (103) to the short parallel edge (110). The semi-circular top edge (103) has two ends, one at an intersection with the first converging edge (111) and one at an intersection with the second converging edge (112).

The term "converging" in reference to the first converging edge (111) and the second converging edge (112) refers to the concept that a trapezoid is formed by four lines comprising (1) a line (107) between the intersection of the semi-circular top edge (103) with the first converging edge (111) and the intersection of the semi-circular top edge (103) with the second converging edge (112), (2) the first converging edge (111), (3) the second converging edge (112) and (4) the short edge (110). These four lines form two parallel edges (107 and 110) and two non-parallel edges (111 and 112). As this trapezoid is a planar body, the two non-parallel edges (111 and 112) are converging towards the short parallel edge (110), and diverging towards the semi-circular top edge (103). In this configuration, the measurement (length) of the short parallel edge (110) is less than the measurement (length) of the line (107)

The 90-degree offset parabolic reflector side (102) has a parabolic reflector face (113), which may be a highly reflective coating or film. When the parabolic solar concentrator enclosure (101) is facing the sun, the parabolic reflector face (113) is oriented to reflect sunlight (108) towards the sunlight window side (114). The parabolic reflector face (113) may comprise any portion of the 90-degree offset parabolic reflector side (102) from a minor fraction up to and including the entire surface of the 90-degree offset parabolic reflector side (102). The parabolic reflector face (113) of the 90-degree offset parabolic reflector side (102) is angularly optimized to concentrate and reflect sunlight at approximately 90 degrees into the sunlight window (114).

Attached to the 90-degree offset parabolic reflector side (102) at the first converging edge (111) is a first reflector side (122). Attached to the 90-degree offset parabolic reflector side (102) at the second converging edge (112) is a second reflector side (123).

Figure 3:
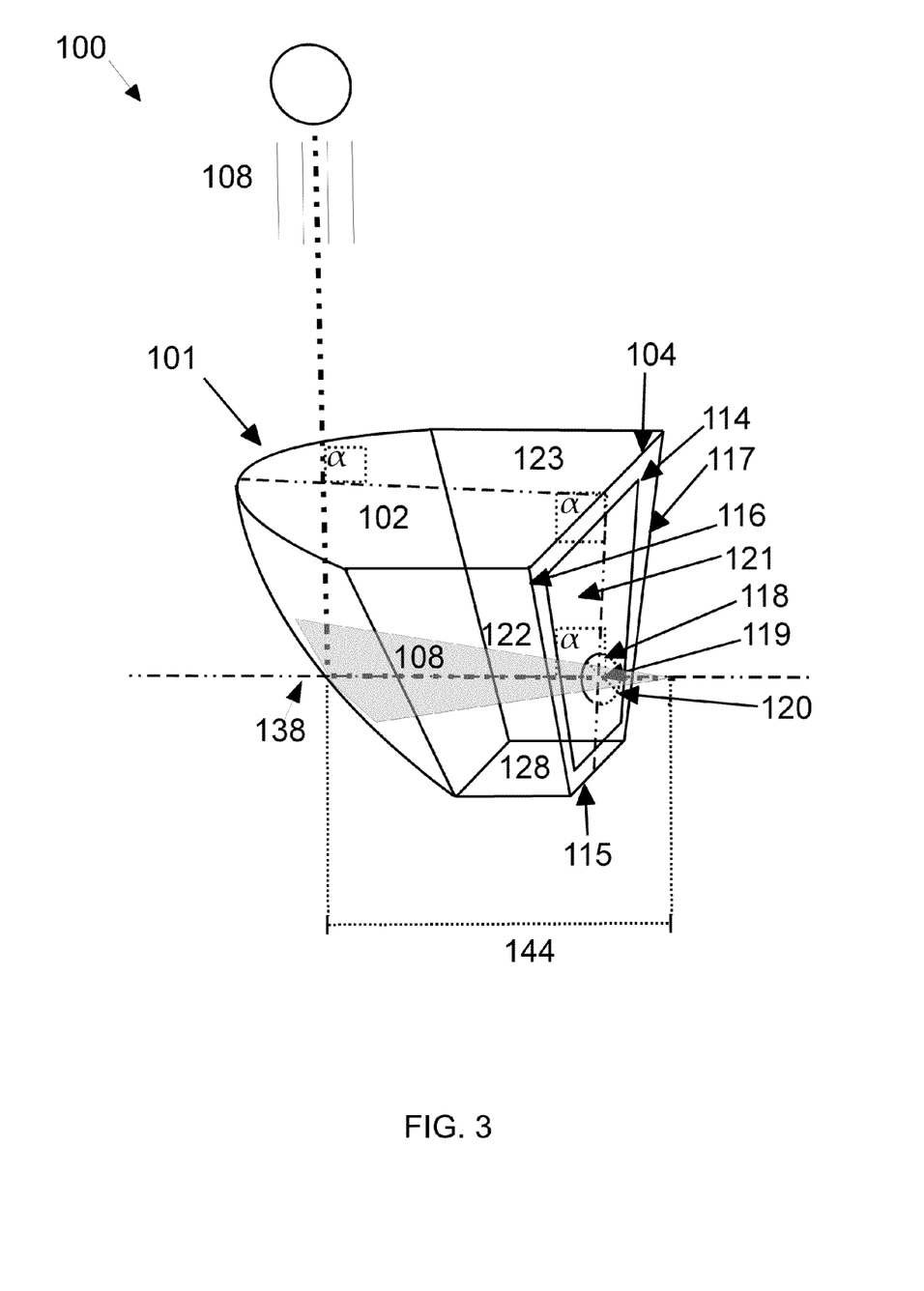
FIG. 3 is a partial drawing of the parabolic solar concentrator system (100) with its parabolic solar concentrator enclosure (101) showing the sunlight window side (114).

FIG. 3 is a partial drawing of the solar concentrator system (100) with its parabolic solar concentrator enclosure (101) showing the sunlight window side (114).

Of the features as shown in FIG. 3 are the solar concentrator system (100), the parabolic solar concentrator enclosure (101), a sunlight window side (114), a sunlight window side long parallel edge (104), sunlight (108), a sunlight window side short parallel edge (115), a sunlight window side first converging edge (116), a sunlight window side second converging edge (117), a sunlight window (118) with a center (119) and a diameter (120), a flat reflector face (121), the 90-degree offset parabolic reflector side (102), the first reflector side (122), the second reflector side (123), and the base side (128).

The sunlight window side (114) is opposite of the 90-degree offset parabolic reflector side (102) in the solar concentrator enclosure (101).

The sunlight window side (114) in the shape of a trapezoid having a long parallel edge (104). The measurement of the long parallel edge (104) is equal in measurement to the line (107).

The sunlight window side (114) has a short parallel edge (115) that is parallel to the long parallel edge (104) and is attached to a base side (128). The measurement of the short parallel edge (115) is the same as the attached edge of the base side (128).

The sunlight window side (114) has a first converging edge (116) and a second converging edge (117), which are equal in measurement and are attached at the long parallel edge (104) and terminate at the short parallel edge (115). The term "converging" is explained above.

The sunlight window side (114) has a flat reflector face (121). The flat reflector face (121) may be a highly reflective coating or film. The flat reflector face (121) reflects sunlight that does not enter the sunlight window (118) towards and off another side, such as the 90-degree offset parabolic reflector side (102), the first reflector side (122), the second reflector side (123) or the base side (128), and then into the sunlight window (118). The flat reflector face (121) may comprise any portion of the sunlight window side (114) from a minor fraction up to and including the entire surface of the sunlight window side (114).

Located on the sunlight window side (114) is a sunlight window (118). The sunlight window (118) has a center (119) and a diameter (120). The center (119) of the diameter (120) of the sunlight window (118) is located along a focal line (138) of the 90-degree offset parabolic reflector side (102) near the focal point of the 90-degree offset parabolic reflector side (102). The sunlight window (118) is relatively small to limit the heat loss.

The principle of placing the center (119) of the diameter (120) of the sunlight window (118) at the focal point of the 90-degree offset parabolic reflector side (102) is so that sunlight (108) strikes the parabolic reflector face (113) of the 90-degree offset parabolic reflector side (102) and is concentrated into the sunlight window (118).

This concentration, from the 90-degree offset parabolic reflector side (102) and from the parabolic solar concentrator enclosure (101), significantly increases the heating ability of the sunlight conversion device (142).

Attached to the sunlight window side (114) at the first converging edge (116) is a first reflector side (122). Attached to the sunlight window side (114) at the second converging edge (117) is a second reflector side (123).

As indicated by the right angle symbols, the sunlight window side (114) is generally positioned in the parabolic solar concentrator enclosure (101) so that the sunlight window side (114) is close to a right angle (α) to the focal line (138) and to a line that is perpendicular to the incoming sunlight (108).

Figure 4:
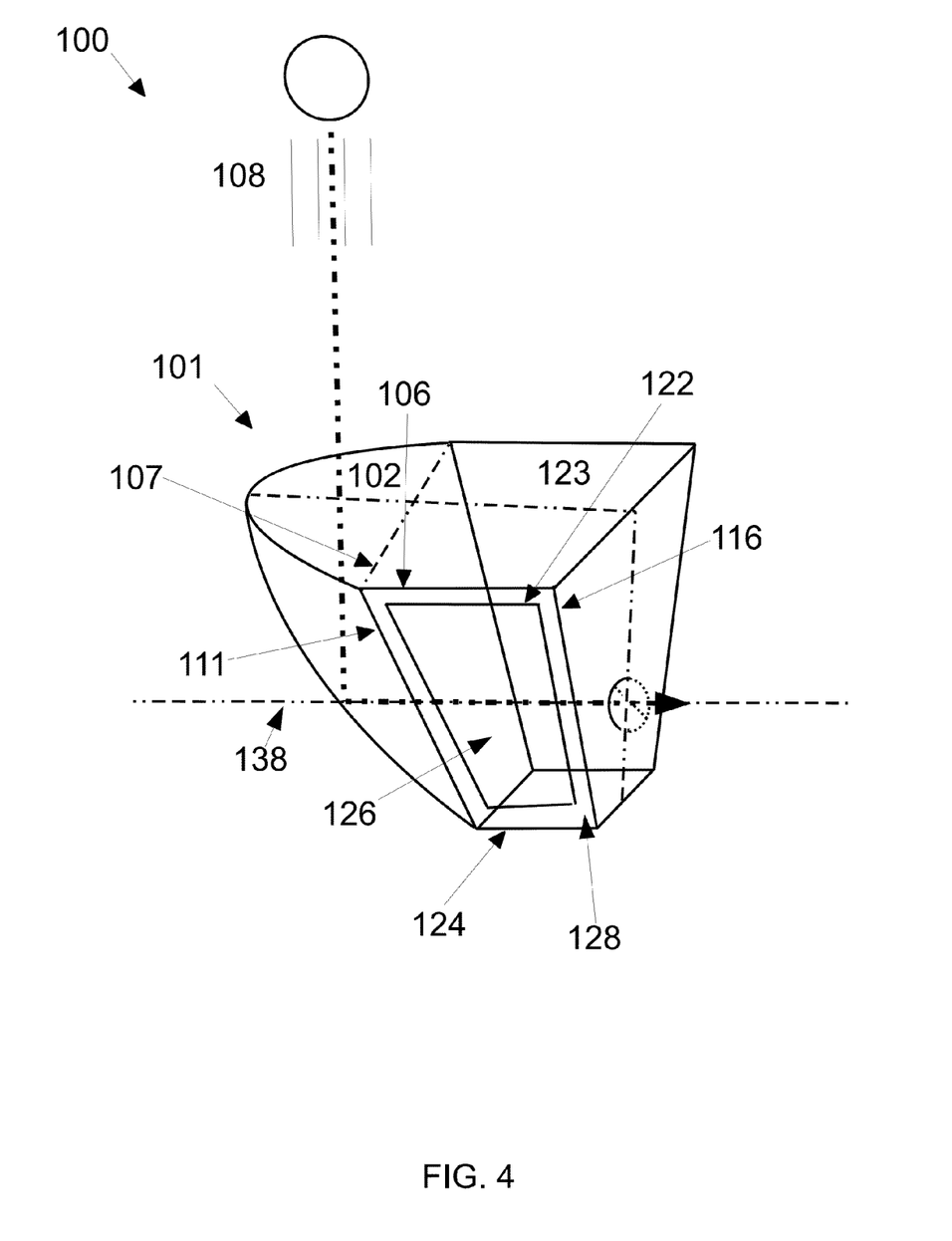
FIG. 4 is a partial drawing of the parabolic solar concentrator system (100) with its parabolic solar concentrator enclosure (101) showing the first reflector side (122).

FIG. 4 is a partial drawing of the solar concentrator system (100) with its parabolic solar concentrator enclosure (101) showing the first reflector side (122).

Of the features as shown in FIG. 4 are the solar concentrator system (100), the parabolic solar concentrator enclosure (101), the 90-degree offset parabolic reflector side (102) with line (107), a first reflector side (122), a first reflector side long parallel edge (106), sunlight (108), a first reflector side short parallel edge (124), a first reflector side first converging edge (111), a first reflector side second converging edge (116), a flat reflector face (126), the second reflector side (123), and the base side (128).

The first reflector side (122) is between the 90-degree offset parabolic reflector side (102) and the sunlight window side (114).

The first reflector side (122) is in the shape of a trapezoid having a long parallel edge (106). The measurement of the long parallel edge (106) is equal in measurement to the parabolic reflector side line (107).

The first reflector side (122) has a short parallel edge (124) that is parallel to the long parallel edge (106) and is attached to a base side (128). The length of the short parallel edge (124) is the same as the attached edge of the base side (128).

The first reflector side (122) has a first converging edge (111) and a second converging edge (116), which are equal in measurement and are attached to the long parallel edge (106) and terminate at the short parallel edge (124). The term "converging" is explained above.

The first reflector side (122) has a flat reflector face (126). The flat reflector face (122) may be a highly reflective coating or film. The flat reflector face (126) may comprise any portion of the first reflector side (122) from a minor fraction up to and including the entire surface of the first reflector side (122).

This orientation of the first reflector side (122) and the flat reflector face (126) is to reflect sunlight (108) towards and off another side, such as the 90-degree offset parabolic reflector side (102), the sunlight window side (114), the second reflector side (123) or the base side (128), and into the sunlight window (118).

Attached to the first reflector side (122) at the first converging edge (111) is the parabolic reflector side (122). Attached to the first reflector side (122) at the second converging edge (112) is the sunlight window side (114). The size and orientation of the first reflector side (122) and the second reflector side (123) are mirror images of each other.

Figure 5:
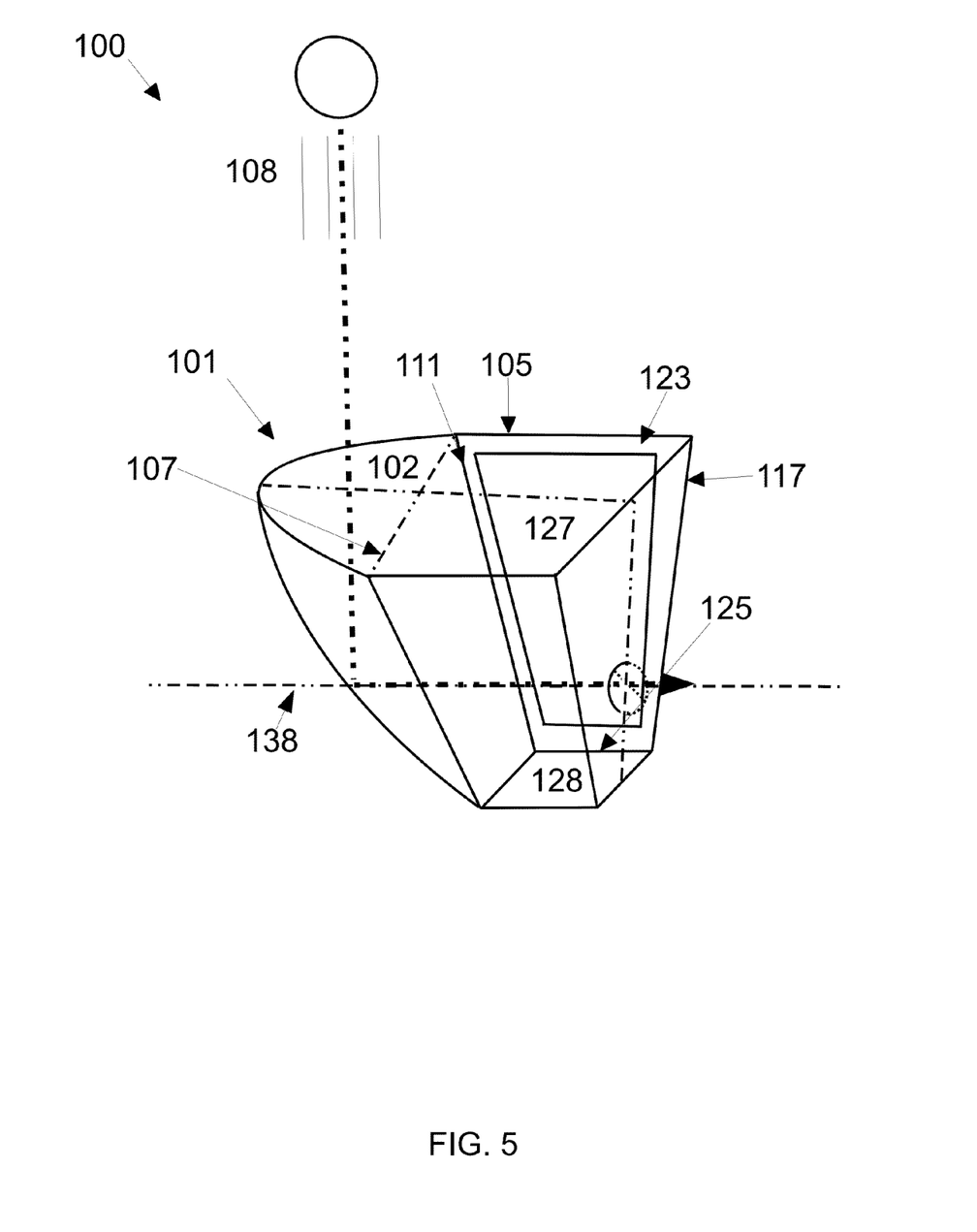
FIG. 5 is a partial drawing of the parabolic solar concentrator system (100) with its parabolic solar concentrator enclosure (101) showing the second reflector side (123).

FIG. 5 is a partial drawing of the solar concentrator system (100) with its parabolic solar concentrator enclosure (101) showing the second reflector side (123).

Of the features as shown in FIG. 5 are the solar concentrator system (100), the parabolic solar concentrator enclosure (101), the 90-degree offset parabolic reflector side (102) with line (107), a second reflector side (122), a second reflector side long parallel edge (105), sunlight (108), a second reflector side short parallel edge (125), a second reflector side first converging edge (112), a second reflector side second converging edge (117), a flat reflector face (127), the first reflector side (122), and the base side (128).

The second reflector side (123) is between the 90-degree offset parabolic reflector side (102) and the sunlight window side (114) and is opposite the first reflector side (122) in the parabolic solar concentrator enclosure (101).

The second reflector side (122) is in the shape of a trapezoid having a long parallel edge (105). The second reflector side (127) has a short parallel edge (125) that is parallel to the long parallel edge (105) and is attached to a base side (128). The length of the short parallel edge (125) is the same as the attached edge of the base side (128).

The second reflector side (123) has a first converging edge (112) and a second converging edge (117), which are equal in measurement and are attached to the long parallel edge (105) and terminate at the short parallel edge (125). The term "converging" is explained above.

The second reflector side (123) has a flat reflector face (127). The flat reflector face (127) may be a highly reflective coating or film. The flat reflector face (127) may comprise any portion of the first reflector side (123) from a minor fraction up to and including the entire surface of the first reflector side (123).

This orientation of the first reflector side (123) and the flat reflector face (127) is to reflect sunlight (108) towards and off another side, such as the 90-degree offset parabolic reflector side (102), the sunlight window side (114), the first reflector side (122) or the base side (128), and into the sunlight window (118).

Attached to the second reflector side (123) at the first converging edge (112) is the parabolic reflector side (122). Attached to the second reflector side (123) at the second converging edge (117) is the sunlight window side (114). The size and orientation of the first reflector side (122) and the second reflector side (123) are mirror images of each other.

Figure 6:
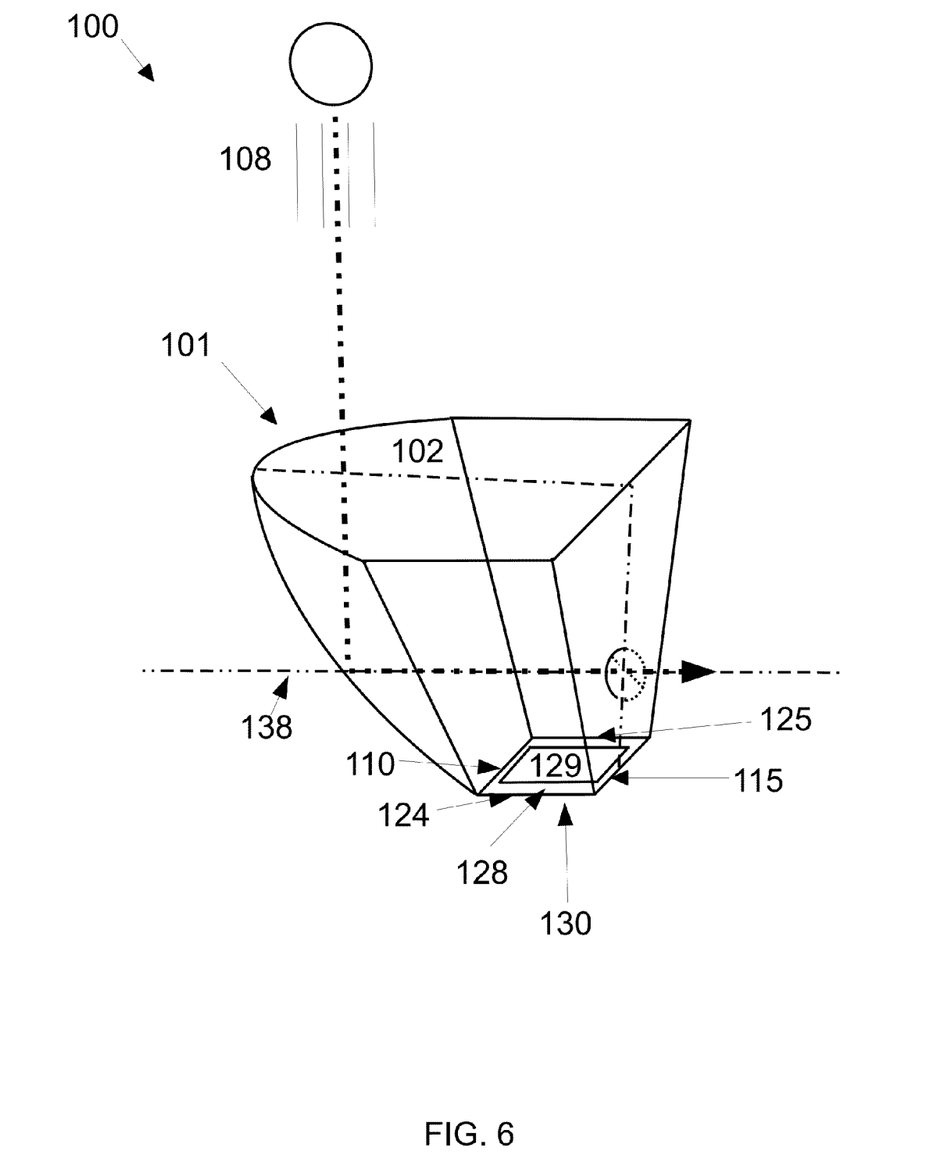
FIG. 6 is a partial drawing of the parabolic solar concentrator system (100) with its parabolic solar concentrator enclosure (101) showing the base side (128).

FIG. 6 is a partial drawing of the solar concentrator system (100) with its parabolic solar concentrator enclosure (101) showing the base side (128).

Of the features as shown in FIG. 6 are the solar concentrator system (100), the parabolic solar concentrator enclosure (101), the 90-degree offset parabolic reflector side (102), sunlight (108), a parabolic reflector side short parallel edge (110), a sunlight window side short parallel edge (115), a first reflector side short parallel edge (124), a second reflector side short parallel edge (125), a base side reflector inner face (129), and a base side outer face (130).

The base side (128) is essentially rectangular. The measurement of the parabolic reflector side short parallel edge (110) is approximately equal to that of the sunlight window side short parallel edge (115). The measurement of the first reflector side short parallel edge (124) is approximately equal to that of the second reflector side short parallel edge (125).

The base side (128) has a base side reflector inner face (129). This orientation of the base side (128) and the base side reflector inner face (129) is to reflect sunlight (108) towards and off another side, such as the 90-degree offset parabolic reflector side (102), the sunlight window side (114), the first reflector side (122) or the second reflector side (123), and into the sunlight window (118).

The base side (128) has a base side outer face (130). The base side outer face (130) forms an outer face of the parabolic solar concentrator enclosure (101) to affix the parabolic solar concentrator enclosure (101) to the framing and control systems.

Figure 7:
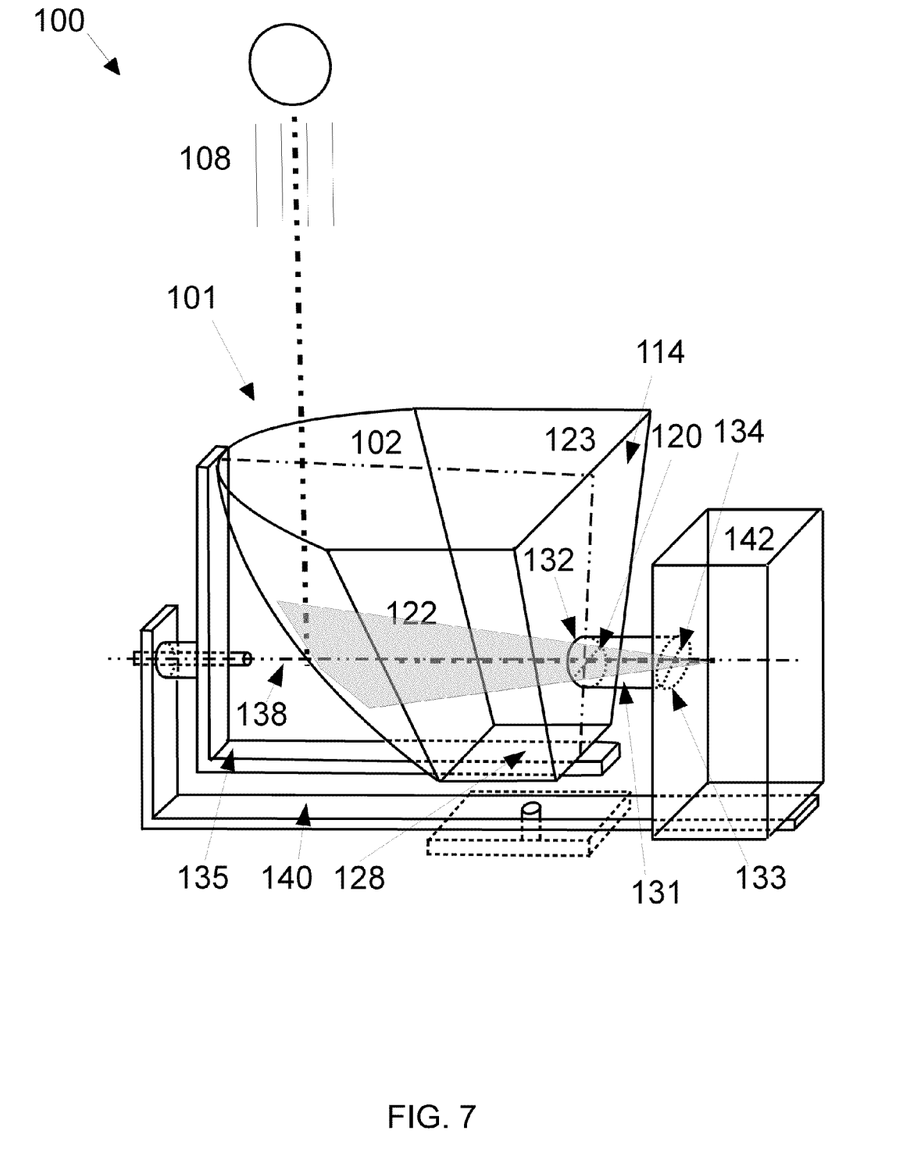
FIG. 7 is a partial drawing of the parabolic solar concentrator system (100) with its parabolic solar concentrator enclosure (101) showing the loss reduction tube (131) and an exemplary sunlight conversion device (142).

FIG. 7 is a partial drawing of the solar cooking system (100) with its parabolic solar concentrator enclosure (101), the loss reduction tube (131) and the sunlight conversion device (142).

Of the features as shown in FIG. 7 are the solar cooking system (100), the parabolic solar concentrator enclosure (101), the 90-degree offset parabolic reflector side (102), sunlight (108), the sunlight window side (114), a loss reduction tube (131), a loss reduction tube first end (132), a sunlight aperture (133), a sunlight aperture diameter (134), the focal line (138), and the sunlight conversion device (142).

Rotationally positioned between the parabolic solar concentrator enclosure (101) and the sunlight conversion device (142) may be a loss reduction tube (131). The loss reduction tube (131) has a loss reduction tube first end (132) that coincides with the sunlight window (118) on the sunlight window side (114). As they coincide, they share the same center (119), and sunlight window diameter (120). The loss reduction tube (131) is rotationally positioned at the first end (132) to the sunlight window (118).

The center (119) of the sunlight window (118) is also the center of the loss reduction tube (131), which coincides with the focal line (138). The interior of the loss reduction tube (131) is generally reflective to transmit sunlight (108) from the parabolic solar concentrator enclosure (101) into the sunlight conversion device (142). At the sunlight conversion device (142) end of the loss reduction tube (131) is the sunlight aperture (133). The sunlight aperture (133) has a diameter (134). To optimize sunlight transmission, the measurement of the sunlight aperture diameter (134) is about the same measurement as the sunlight window diameter (120).

Sunlight (108) concentrated by the parabolic solar concentrator enclosure (101) exits the loss reduction tube (131) at the sunlight aperture (133) into the sunlight conversion device (142).

Figure 8:
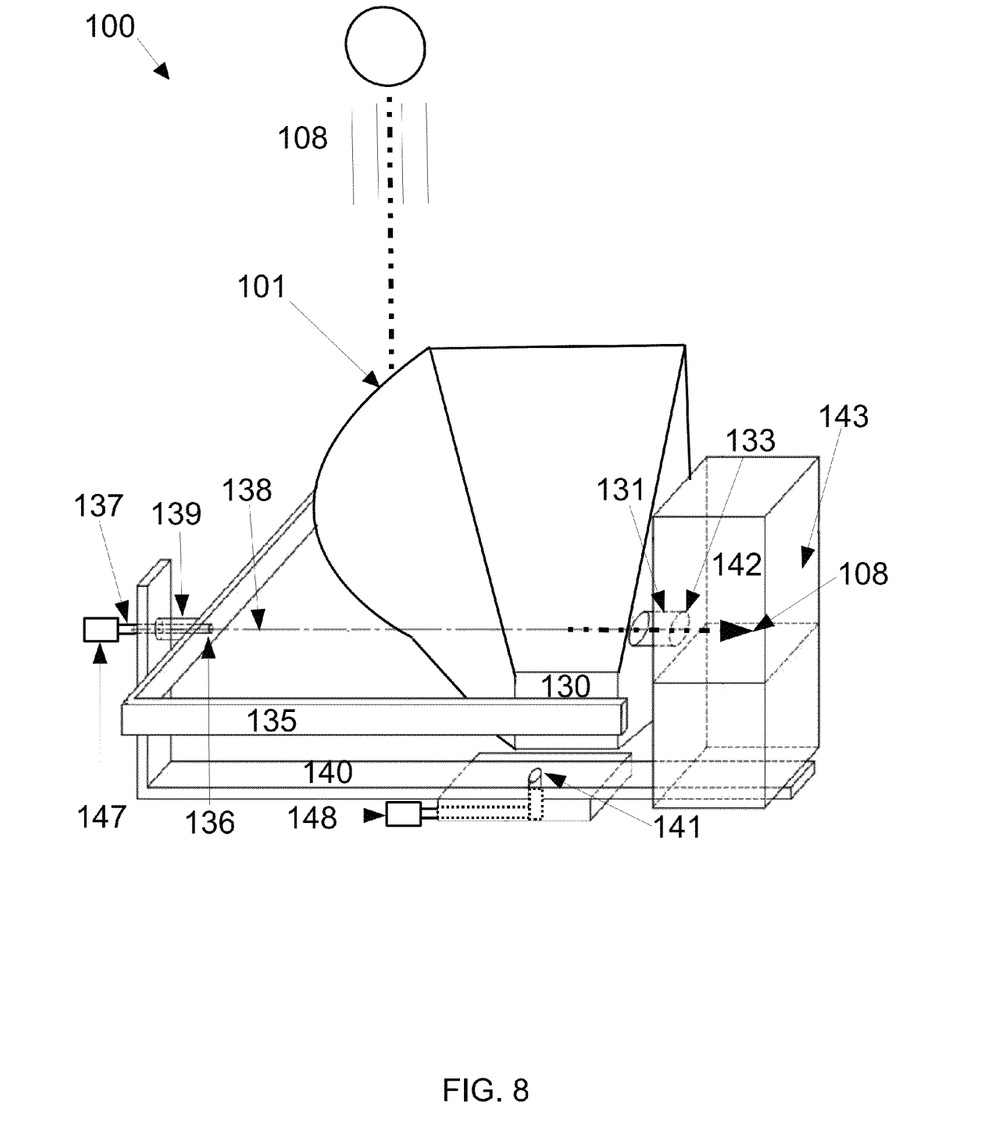
FIG. 8 is a partial drawing of the parabolic solar concentrator system (100) with its parabolic solar concentrator enclosure (101) and the exemplary sunlight conversion device (142) showing the elevation tracking rotation axis frame (135) and the azimuth tracking rotation axis frame (140) for aligning the solar concentrator system (100) with the sun (108).

FIG. 8 is a partial drawing of the solar cooking system (100) with its parabolic solar concentrator enclosure (101) and the sunlight conversion device (142) showing the elevation tracking rotation axis frame (135) and the azimuth tracking rotation axis frame (140) for aligning the solar cooking system (100) with the sun (108).

Of the features as shown in FIG. 8 are the solar cooking system (100), the parabolic solar concentrator enclosure (101), sunlight (108), the base side outer face (130), the loss reduction tube (131), a elevation tracking rotation axis frame (135), a elevation tracking rotation pin (136), a elevation tracking rotation pin center (137), a focal line (138), a elevation tracking rotation collar (139), a azimuth tracking rotation axis frame (140), a azimuth tracking rotation pin (141), and a sunlight conversion device (142).

A thermal switch is attached to the cooking chamber inner side (143). When the temperature of thermal switch reaches the pre-set oven temperature, the thermal switch will open which will stop the solar tracking of the tracker or cause the window cover to block the sunlight. Then the oven temperature will go down. If the oven temperature is lower than the pre-set temperature, the thermal switch will close again which will start the tracker and have more sunlight entering the oven to increase its temperature. Therefore, the oven temperature is controlled and maintained.

Rotationally positioned to between the parabolic solar concentrator enclosure (101) and the sunlight conversion device (142) is the loss reduction tube (131). Sunlight (108) concentrated by the parabolic solar concentrator enclosure (101) exits the loss reduction tube (131) at the sunlight aperture (133) into the sunlight conversion device (142). This sunlight may be used in any one or more ways to cook food, heat materials, fluids, etc.

Insider the sunlight conversion device (142) may be an optional cooking chamber inner side (143). The optional cooking chamber inner side (143) improves the heat absorption of any food, materials or fluids placed inside the sunlight conversion device (142). The optional cooking chamber inner side (143) may reflective, or may absorptive.

Assuring the parabolic solar concentrator enclosure (101) receives the best sunlight (108) is important. To facilitate the best use, the solar cooking system (100) with its parabolic solar concentrator enclosure (101) and the sunlight conversion device (142) incorporates two-axis tracking.

The elevation tracking rotation axis frame (135) and the azimuth tracking rotation axis frame (140) are components of the solar cooking system (100) for aligning the solar cooking system (100) with the sun (108).

The elevation tracking rotation axis frame (135) is used to optimize the sunlight (108) by adjusting the elevation of the solar cooking system (100) with its parabolic solar concentrator enclosure (101) and the sunlight conversion device (142) as the sun travels along the sky.

The elevation tracking rotation axis frame (135) may be attached to the parabolic solar concentrator enclosure (101) at the base side outer face (130), at the sunlight conversion device (142), or at other places. The elevation tracking rotation axis frame (135) may be attached to the base side outer face (130) and the sunlight conversion device (142). The elevation tracking rotation axis frame (135) may be attached at other places of the parabolic solar concentrator enclosure (101) and the sunlight conversion device (142). The number of attachment positions would depend on the size and weight of the materials used to contracts the solar cooking system (100) with its parabolic solar concentrator enclosure (101) and the sunlight conversion device (142). These materials may be wood, metal, plastic, cardboard, foil, paper, etc. This list is not inclusive or exclusive.

The elevation tracking rotation axis frame (135) rotates with respect to the azimuth tracking rotation axis frame (140), To facilitate this rotation, attached to the elevation tracking rotation axis frame (135) is an elevation tracking rotation pin (136) and an elevation tracking rotation collar (139). The elevation tracking rotation pin (136) and the elevation tracking rotation collar (139) connect the elevation tracking rotation axis frame (135) to the azimuth tracking rotation axis frame (140).

In general, one of the elevation tracking rotation pin (136) or the elevation tracking rotation collar (139) will be fixed to the elevation tracking rotation axis frame (135), while the other will be fixed to the azimuth tracking rotation axis frame (140).

As such, the attachment of the elevation tracking rotation pin (136) to the elevation tracking rotation axis frame (135) may be fixed, or the elevation tracking rotation pin (136) may be rotationally attached to the elevation tracking rotation axis frame (135). The attachment of the elevation tracking rotation collar (139) to the elevation tracking rotation axis frame (135) may be fixed, or the elevation tracking rotation collar (139) may be rotationally attached to the elevation tracking rotation axis frame (135).

Conversely, the attachment of the elevation tracking rotation pin (136) to the azimuth tracking rotation axis frame (140) may be fixed, or the elevation tracking rotation pin (136) may be rotationally attached to the azimuth tracking rotation axis frame (140).

Likewise, the attachment of the elevation tracking rotation collar (139) to the azimuth tracking rotation axis frame (140) may be fixed, or the elevation tracking rotation collar (139) may be rotationally attached to the azimuth tracking rotation axis frame (140).

To assure optimum alignment of the parabolic solar cooking system (100) with its parabolic solar concentrator enclosure (101) and the sunlight conversion device (142) with respect to the sun, the elevation tracking rotation pin (136) and the elevation tracking rotation collar (139) are aligned to the elevation tracking rotation pin center (137). The elevation tracking rotation pin center (137) is also along the focal line (138), as is the loss reduction tube (131), as was previously discussed. Such design and alignment will ensure that the sunlight conversion device (142) does not move or rotate in the elevation direction as the sun moves. This is convenient for various uses of the sunlight conversion device (142).

The azimuth tracking rotation axis frame (140) is used to optimize the sunlight (108) by adjusting the azimuth of the parabolic solar cooking system (100) with its parabolic solar concentrator enclosure (101) and the sunlight conversion device (142) as the sun travels along the sky. The azimuth tracking rotation pin (141) allows the azimuth tracking rotation axis frame (140) to rotate the parabolic solar cooking system (100) with its parabolic solar concentrator enclosure (101) and the sunlight conversion device (142) towards the sun.

In some embodiments, the parabolic solar concentrator system (100) may further comprise one or more of an elevation tracking drive (147) or an azimuth tracking drive (148).

In some embodiments, the sunlight conversion device (142) of the parabolic solar concentrator system (100) may be a BBQ smoker, a water distiller, a food dehydrator, a circulating heat system, a clothes dryer, an absorption refrigerator, a thermal engine, or a photovoltaic panel.

In some embodiments, the parabolic solar concentrator system (100) may further comprise a cover over the parabolic solar concentrator enclosure (101) for adjusting the quantity of sunlight entering the parabolic solar concentrator enclosure (101), a sunlight blocking device for adjusting the quantity of sunlight entering the sunlight conversion device (142), a thermostatically controlled sunlight blocking device for adjusting the quantity of sunlight entering the sunlight conversion device (142), thermometer for measuring the sunlight conversion device (142) temperature, at least one reflective inner side (143) in the sunlight conversion device (142), or at least one absorptive inner side (143) in the sunlight conversion device (142).

In some embodiments, a large thermal mass, such as water, bricks, or salts, may be placed inside the sunlight conversion device (142). When the sunlight conversion device (142) temperature is going up under concentrated sunlight, the thermal mass absorbs some of the heat and stores the thermal energy. Since the oven is well insulated, the thermal mass at high temperature can cook foods in the sunlight conversion device (142) later if sunlight is not available due to cloud or sunset. This becomes a solar cooking system with thermal storage.

In some embodiments, the sunlight conversion device (142) may have one or more transparent covers on the sunlight aperture (133) to limit the heat loss from the sunlight conversion device (142).

Figure 9:
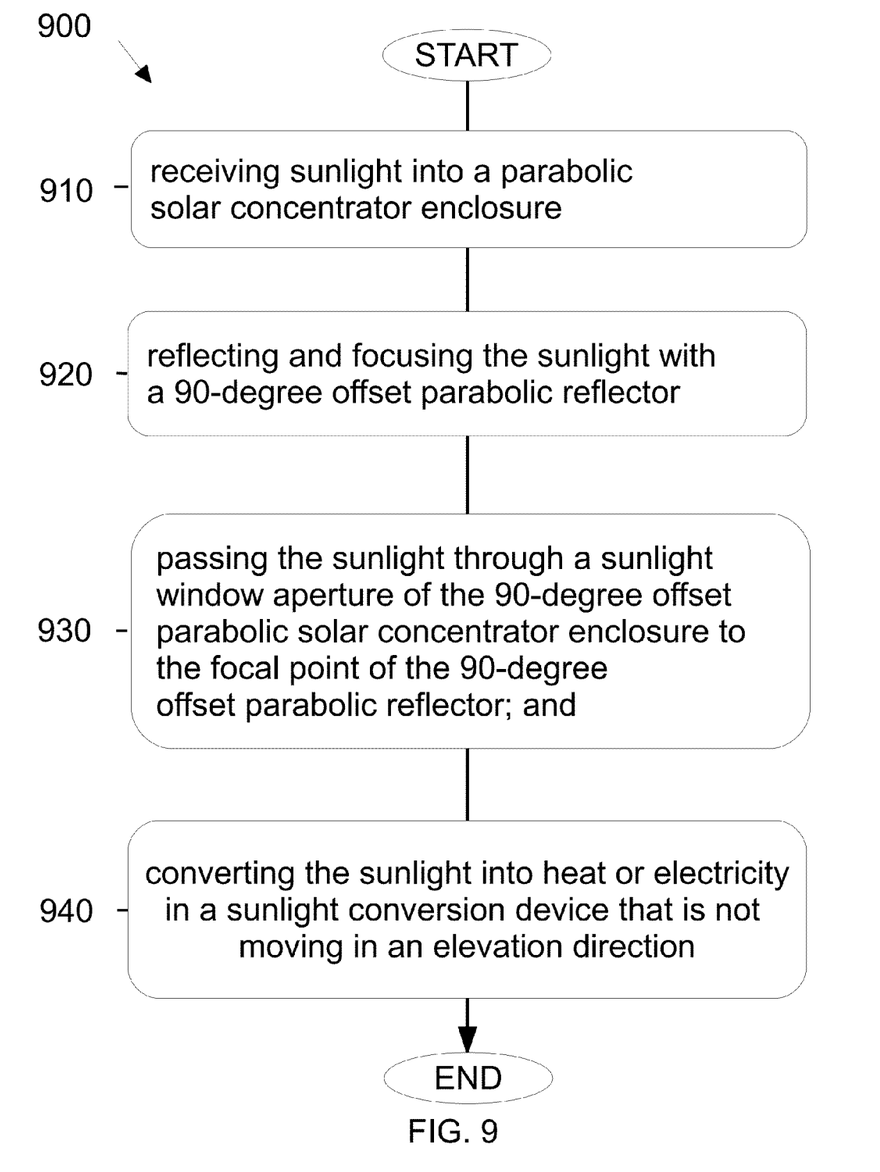
FIG. 9 is a drawing of a method for converting sunlight to heat or electricity.

FIG. 9 is a drawing of a method for converting sunlight to heat or electricity. As shown in FIG. 9, he method comprises: step 910—receiving sunlight into a parabolic solar concentrator enclosure; step 920—reflecting and focusing the sunlight with a 90-degree offset parabolic reflector; step 930—passing the sunlight through an sunlight window aperture of the 90-degree offset parabolic solar concentrator enclosure to the focal point of the 90-degree offset parabolic reflector; and step 940—converting the sunlight into heat or electricity in a sunlight conversion device that is not moving in an elevation direction.

The foregoing description of the preferred embodiments of the invention is by way of example only, and other variations of the above-described embodiments and methods are provided by the present invention. The embodiments described herein are presented for illustration and are not intended to be exhaustive or limiting. Many variations and modifications are possible in light of the foregoing teaching.

What is claimed is:
1. A parabolic solar concentrator system comprising:
a) a parabolic solar concentrator enclosure having a 90-degree offset parabolic reflector side in the shape of a paraboloid for focusing sunlight to a focal point F located a focal length from the 90-degree offset parabolic reflector side, with
b) the 90-degree offset parabolic reflector side having a semi-circular edge with two ends oriented such that a line between the two ends forms a long parallel edge of a trapezoid, with a short parallel edge attached to a base side, with a first converging edge and a second converging edge equal in measurement and attached to the semi-circular top edge and terminating at the short parallel edge, with the 90-degree offset parabolic reflector side having a parabolic reflector face oriented to reflect sunlight toward a sunlight window side, and the short parallel edge is smaller in measurement than the line between the two ends of the semi-circular edge and is equal in measurement to the edge of the base side;
c) a sunlight window side comprising an opposite side of the parabolic solar concentrator enclosure from the 90-degree offset parabolic reflector side, the sunlight window side in the shape of a trapezoid having a long parallel edge, with a short parallel edge attached to the base side, with a first converging edge and a second converging edge equal in measurement and attached to the long parallel edge and terminating at the short parallel edge, with the sunlight window side having a sunlight window with a center of a diameter, with the center of the diameter located along a focal line of the 90-degree offset parabolic reflector side and the short parallel edge is smaller in measurement than the long parallel edge and equal in measurement to edge of the base side;
d) a first reflector side and a second reflector side in the shape of a trapezoid, the first reflector side and the second reflector side comprising opposite sides of the parabolic solar concentrator enclosure, with the first reflector side and the second reflector side connected between the 90-degree offset parabolic reflector side and the sunlight window side, with the first reflector side having a long parallel edge and a short parallel edge attached to the base side, with the second reflector side having a long parallel edge and a short parallel edge attached to the base side, with the first reflector side having a first converging edge and a second converging edge equal in measurement and attached to the long parallel edge and terminating at the short parallel edge, with the second reflector side having a first converging edge and a second converging edge equal in measurement and attached to the long parallel edge and terminating at the short parallel edge, with the first reflector side having a flat reflector face oriented towards the second reflector side and the second reflector side having a flat reflector face oriented towards the first reflector side, and the short parallel edges of the first reflector side and the second reflector side equal in measurement to and attached to opposite edges of the base side;
e) a base side with a first base edge attached to the short parallel edge of the 90-degree offset parabolic reflector side, a second base edge attached to the short parallel edge of the sunlight window side, a third base edge attached to the short parallel edge of the first reflector side and a fourth base edge attached to the short parallel edge of the second reflector side, with all base edges equal in measurement, with a reflector inner face facing towards the sunlight and a base outer face facing away from the parabolic solar concentrator enclosure;
f) an elevation tracking rotation axis frame attached to the parabolic solar concentrator enclosure and having a elevation tracking rotation pin with a center that is aligned on the focal line with the center of the diameter of the sunlight window and with the focal point F of the 90-degree offset parabolic reflector side;

g) an azimuth tracking rotation axis frame rotationally attached to the elevation tracking rotation axis frame, the azimuth tracking rotation axis frame having a azimuth tracking rotation pin located near the base outer face of the base side, such that the elevation tracking rotation axis frame and parabolic solar concentrator enclosure may rotate independent of the azimuth tracking rotation axis frame to track the sunlight; and h) a sunlight conversion device attached to the azimuth tracking rotation axis frame, and having a sunlight aperture for receiving concentrated sunlight at the focal point F of the 90-degree offset parabolic reflector side.

2. The parabolic solar concentrator system of claim 1 wherein the parabolic reflector face of the 90-degree offset parabolic reflector side is angularly optimized to reflect sunlight at approximately 90 degrees into the sunlight window.

3. The parabolic solar concentrator system of claim 1 further comprising an azimuth tracking drive.

4. The parabolic solar concentrator system of claim 1 further comprising an elevation tracking drive.

5. The parabolic solar concentrator system of claim 1 further comprising an azimuth tracking drive and an elevation tracking drive.

6. The parabolic solar concentrator system of claim 1 further comprising a loss reduction tube rotationally positioned at the sunlight window for transmitting sunlight from the parabolic solar concentrator enclosure to a sunlight conversion device.

7. The solar concentrator system of claim 1 wherein the sunlight conversion device is a cooking chamber.

8. The solar concentrator system of claim 1 wherein the sunlight conversion device is a water distiller.

9. The solar concentrator system of claim 1 wherein the sunlight conversion device is a food dehydrator.

10. The solar concentrator system of claim 1 wherein the sunlight conversion device is a circulating heat system.

11. The solar concentrator system of claim 1 wherein the sunlight conversion device is a BBQ smoker.

12. The solar concentrator system of claim 1 wherein the sunlight conversion device is a clothes dryer.

13. The solar concentrator system of claim 1 wherein the sunlight conversion device is an absorption refrigerator.

14. The solar concentrator system of claim 1 wherein the sunlight conversion device is a thermal engine.

15. The solar concentrator system of claim 1 wherein the sunlight conversion device is a photovoltaic panel.

16. The parabolic solar concentrator system of claim 1 further comprising at least one reflective inner side in the sunlight conversion device.

17. The parabolic solar concentrator system of claim 1 further comprising at least one absorptive inner side in the sunlight conversion device.

18. The parabolic solar concentrator system of claim 1 further comprising a cover over the parabolic solar concentrator enclosure for adjusting the quantity of sunlight entering the parabolic solar concentrator enclosure.

19. The parabolic solar concentrator system of claim 1 further comprising a sunlight blocking device for adjusting the quantity of sunlight entering the sunlight conversion device.

20. The parabolic solar concentrator system of claim 1 further comprising a thermostatically controlled sunlight blocking device for adjusting the quantity of sunlight entering the sunlight conversion device.

21. The parabolic solar concentrator system of claim 1 further comprising a thermometer for measuring the sunlight conversion device temperature.

22. The solar concentrator system of claim 1 further comprising thermal switch in the sunlight conversion device.

23. The parabolic solar concentrator system of claim 1 further comprising a transparent cover on the sunlight aperture to limit the heat loss from the sunlight conversion device.

* * * * *